United States Patent [19]

Cooper

[11] Patent Number: 4,626,708
[45] Date of Patent: Dec. 2, 1986

[54] ELECTRONIC LOGIC TO ENHANCE SWITCH RELIABILITY IN DETECTING OPENINGS AND CLOSURES OF REDUNDANT SWITCHES

[75] Inventor: James A. Cooper, Albuquerque, N. Mex.

[73] Assignee: The United States of America as represented by the United States Department of Energy, Washington, D.C.

[21] Appl. No.: 572,338

[22] Filed: Jan. 20, 1984

[51] Int. Cl.$^4$ .............. H03K 19/003; H04L 1/00; G06F 7/02; G06F 11/16

[52] U.S. Cl. .................. 307/441; 307/219; 307/247 A; 371/67

[58] Field of Search .......... 307/441, 442, 219, 247 A; 371/14, 67-71

[56] References Cited

U.S. PATENT DOCUMENTS

| | | | |
|---|---|---|---|
| 3,201,701 | 8/1965 | Maitra | 307/441 |
| 3,226,569 | 12/1965 | James | 307/441 |
| 3,543,048 | 11/1970 | Klaschka | 307/441 |
| 3,593,307 | 7/1971 | Gouge, Jr. | 371/14 X |
| 3,795,823 | 3/1974 | Morgan et al. | 307/247 A |
| 3,798,556 | 3/1974 | Ooya et al. | 307/268 X |
| 3,806,714 | 4/1974 | Otsuka et al. | 307/440 X |
| 3,840,753 | 10/1974 | Kuo | 307/442 |
| 3,859,513 | 1/1975 | Chuang et al. | 371/36 |
| 4,054,803 | 10/1977 | Lurtz | 307/442 X |
| 4,105,900 | 8/1978 | Martin et al. | 307/219 |
| 4,125,055 | 11/1978 | Hesse et al. | 307/247 R X |
| 4,154,395 | 5/1979 | Fancy | 307/441 X |
| 4,185,210 | 1/1980 | Zuk | 307/247 A X |
| 4,185,245 | 1/1980 | Fellinger et al. | 307/219 X |
| 4,519,025 | 5/1985 | Fayette | 371/67 X |
| 4,525,635 | 6/1985 | Gillberg | 307/247 A X |

*Primary Examiner*—John S. Heyman
*Assistant Examiner*—David R. Bertelson
*Attorney, Agent, or Firm*—James H. Chafin; Albert Sopp; Judson R. Hightower

[57] ABSTRACT

A logic circuit is used to enhance redundant switch reliability. Two or more switches are monitored for logical high or low output. The output for the logic circuit produces a redundant and failsafe representation of the switch outputs. When both switch outputs are high, the output is high. Similarly, when both switch outputs are low, the logic circuit's output is low. When the output states of the two switches do not agree, the circuit resolves the conflict by memorizing the last output state which both switches were simultaneously in and produces the logical complement of this output state. Thus, the logic circuit of the present invention allows the redundant switches to be treated as if they were in parallel when the switches are open and as if they were in series when the switches are closed. A failsafe system having maximum reliability is thereby produced.

14 Claims, 3 Drawing Figures

EXCITATION → Y

| $X_1X_2$ | 00 | 01 | 11 | 10 |
|---|---|---|---|---|
| 0 | | | 1 | |
| 1 | 1 | 1 | 1 | 1 |

Y → RESPONSE $Y = X_1 X_2 + Y(X_1 + X_2)$

| | | | |
|---|---|---|---|
| 1 | 1 | 1 | |
| | | 1 | |

Z (OUTPUT)

$Z = X_1 X_2 + \overline{Y}(X_1 + X_2)$

4,626,708

ELECTRONIC LOGIC TO ENHANCE SWITCH RELIABILITY IN DETECTING OPENINGS AND CLOSURES OF REDUNDANT SWITCHES

The U.S. Government has rights in this invention pursuant to Contract No. DE-AC04-76DP00789 between the U.S. Department of Energy and Western Electric Company.

FIELD OF THE INVENTION

The present invention relates to a logic circuit for enhancing the reliability of detecting switch openings and closures. More particularly, the present invention relates to a circuit for maximizing the reliability of detecting openings and closures of plural redundant switches even though one or more switches may fail to open and/or close.

BACKGROUND OF THE INVENTION

Various types of systems have been used in the past to enhance switch opening and closure reliability. For example, it has been known to place switches in parallel to enhance circuit closing reliablity and to place switches in series in order to enhance circuit opening reliability. However, parallel switch arrangements degrade circuit opening reliability while series switch connection degrades circuit closing reliability.

Past prior art systems have generally utilized varying forms of redundant logic. For example, a plurality of redundant logic elements might be used, each having two output states. In such systems, the redundant logic output is often the majority output of the respective individual circuits. Alternatively, a primary path may be used and monitored to see if a defect has occurred. Upon detection of a defect, the element may be eliminated from the overall circuit and replaced with another element. These prior art redundant logic circuits were generally disadvantageous in that they included excessive elements which increased the chances of circuit failure.

It is therefore an object of the present invention to produce an electronic logic circuit for more reliable detection of switch openings and closures, even though one or more switches may fail to open and/or close.

It is another object of the present invention to utilize knowledge of past circuitry states to enhance reliability of such detection.

It is still another object of the present invention to produce an electronic circuit which monitors the output of redundant switches and simulates the connection of these switches in series during switch opening and parallel during switch closing to increase reliability during these respective states.

It is a further object of the present invention to perform the above-mentioned functions with a circuit having relatively few components and therefore exhibiting extremely high reliability so as not to detract from the otherwise enhanced reliability caused by use of redundant components.

SUMMARY OF THE INVENTION

The present invention monitors the outputs of two or more switches and simulates the interconnection of these switches in series when switch opening is to be detected and in parallel when switch closing is to be detected. These interconnections are simulated by virtue of the inclusion of a memory or storage element in the logic circuit of the present invention.

By virtue of the use of fundamental mode logic, the logic outputs for the respective switches are monitored and the last state in which the outputs of the two switches coincided is memorized within the storage element. Through the use of simple gate logic, an external clock is unnecessary in the device of the present invention. The system output simulates the interconnection of the two switches in parallel when the last simultaneous output of the two switches was an open output. This allows the system to increase switch closing reliability by simulating a parallel circuit. Alternatively, when the last common output state of the switches was a closed output, the circuit simulates the series connection of the switches in order to enhance switch opening reliability.

The system of the present invention includes a logic storage element or flip-flop which memorizes the last common state of the outputs of the switches monitored and facilitates the change in the output state of the logic system upon change of one of the switch inputs. Thus, the output of the device of the present invention is high when both of the switch inputs are high or when the last common state of the switch inputs was low and one of these switches produces a logic high signal. The output is low when both switch inputs are low or when the last common input of the respective switches is high and when one of the switches changes to a low state.

BRIEF DESCRIPTION OF THE DRAWING FIGURES

Other objects and advantages of the present invention will become more readily apparent to one skilled in the art from the following description taken together with the accompanying drawings, in which.

DETAILED DESCRIPTION OF THE PREFERRED EMBODIMENT

Figures 1, 3:
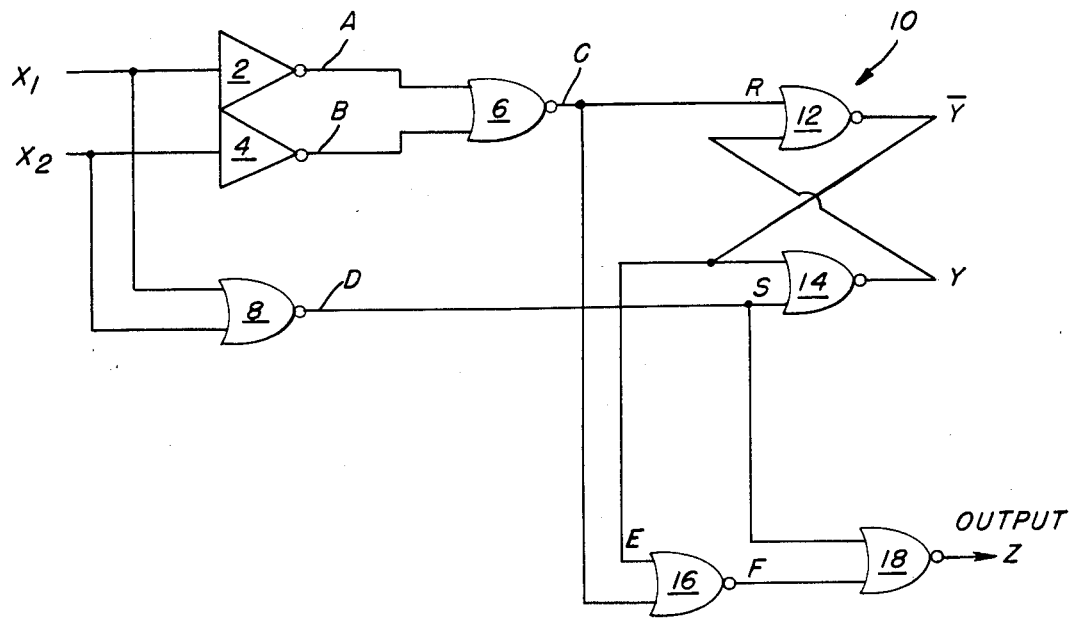
FIG. 1 is a logic circuit diagram of the system of the present invention.
FIG. 3 illustrates a Karnaugh diagram helpful in understanding the logic used by the present invention.

Referring to FIG. 1, the logic circuit of the present invention is illustrated. The circuit receives input from points $X_1$ and $X_2$ from first and second input switches $SW_1$ and $SW_2$ of FIG. 2. Input $X_1$ and $X_2$ are logically high when their corresponding input switches $SW_1$ and $SW_2$ are closed and are logically low when the respective input switches $SW_1$, $SW_2$ are open.

A first inverter 2 inverts the first input $X_1$ to produce a logic $\overline{X_1}$ signal at point A on FIG. 1. Similarly, a second inverter 4 receives the second input signal $X_2$ and produces its logical complement $\overline{X_2}$ at point B in FIG. 1. These respective input complement signals $\overline{X_1}$, $\overline{X_2}$ are presented to the inputs of a first NOR gate 6. The output of this first NOR gate 6 at point C in FIG. 1 is the logical product of the respective circuit inputs $X_1 X_2$. The first and second inputs $X_1$ and $X_2$ are also presented to the inputs of a second NOR gate 8. The output of this second NOR gate 8 at point D is the inverted logical sum of the inputs $\overline{X_1 + X_2}$. From DeMorgan's Law we know that this is equivalent to the logical product of the inverses of the input signals $\overline{X_1}\overline{X_2}$.

Important to the operation of the present invention is the inclusion of a memory element for storage of the last state common to each of the inputs. In the preferred embodiment, a flip-flop 10 is provided as such a memory storage. This flip-flop includes a first flip-flop NOR gate 12 and a second flip-flop NOR gate 14 which are cross connected in a conventional manner. The logical product of the inputs $X_1X_2$ is provided to the reset terminal R of the storage flip-flop 10 (an input to the first flip-flop NOR gate 12). The logic product of the inverted input signals $\overline{X_1}\overline{X_2}$ is applied to a set input S of the storage flip-flop 10 (an input to the second flip-flop NOR gate 14). The signal at point Y within the flip-flop may be expressed as follows:

$$\overline{Y} = \overline{X_1 + X_2} + \overline{Y + X_1X_2}$$

$Y = (Y + X_1X_2)(X_1 + X_2)$ this simplifies to
$Y = Y(X_1 + X_2) + X_1X_2(X_1 + X_2)$
$\therefore Y = Y(X_1 + X_2) + X_1X_2$ A third NOR gate 16 receives the output $\overline{Y}$ of the storage flip-flop 10 at a first input E thereof and receives the logic signal from point C, $X_1X_2$ at the other input thereof. The output of the third NOR gate 16 at point F is therefore:

$$\overline{F} = X_1X_2 + \overline{Y + X_1X_2}$$

$$\therefore F = \overline{X_1X_2} \cdot (Y + X_1X_2).$$

This output of the third NOR gate 16 is introduced to an input of a fourth NOR gate 18 which also receives the output of the second NOR gate 8 $\overline{X_1}\overline{X_2}$ at its other input, point D. The output Z of the fourth NOR gate 18 may therefore be found as follows:
The output $Z = \overline{D + F}$ where D and F are the signals appearing at the respective points of FIG. 1

$\therefore \overline{Z} = D + F$ $= \overline{X_1 + X_2} + (Y + X_1X_2)(\overline{X_1X_2})$ $= \overline{X_1}\overline{X_2} + Y(\overline{X_1} + \overline{X_2}) + X_1X_2(\overline{X_1} + \overline{X_2})$ As $(X_1X_2)(\overline{X_1} + \overline{X_2}) = 0$ $\overline{Z} = \overline{X_1}\overline{X_2} + Y(\overline{X_1} + \overline{X_2})$ $\therefore Z = (X_1 + X_2)(\overline{Y} + \overline{X_1X_2})$ $= (X_1 + X_2)\overline{Y} + (X_1 + X_2)\overline{X_1X_2}$ $\therefore Z = X_1X_2 + \overline{Y}(X_1 + X_2).$ This is the relationship between the inputs and outputs in the circuit of FIG. 1.

Figure 2:
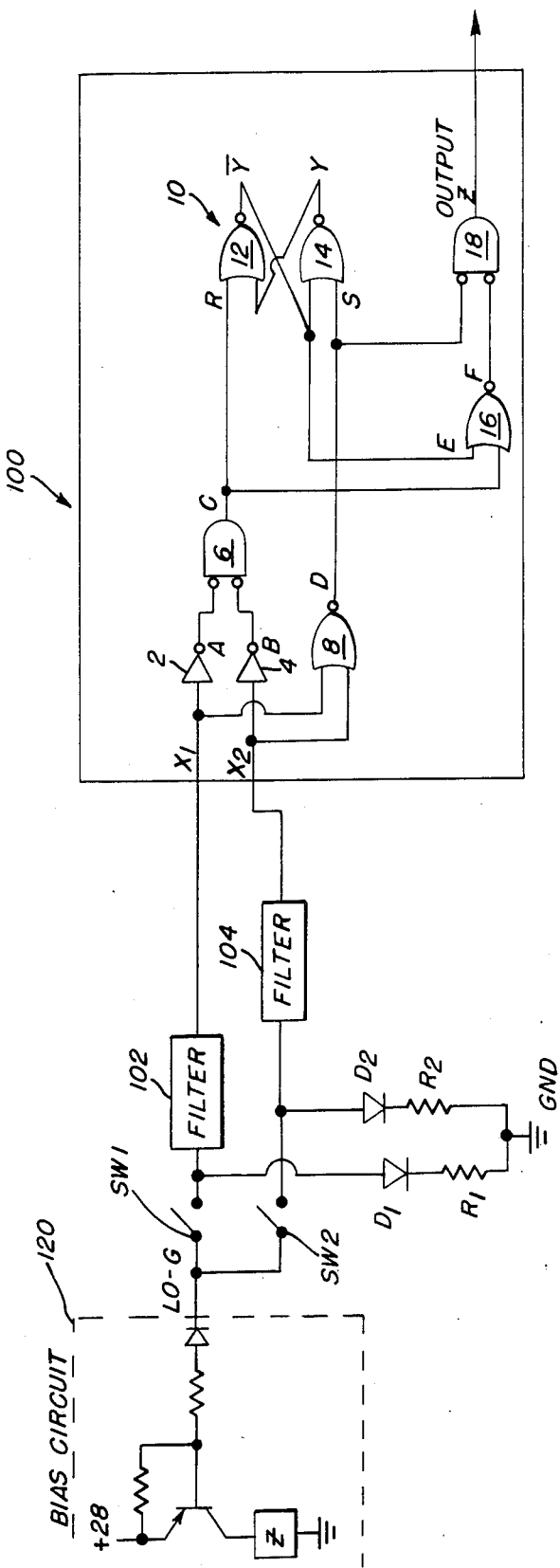
FIG. 2 illustrates the use of the FIG. 1 circuit interfaced with existing switches.

FIG. 2 illustrates the use of the circuit of the present invention to monitor a pair of switches $SW_1$, $SW_2$ to enhance the reliability of detecting opening and closure. The switches of FIG. 2 are supplied with a voltage to a first terminal thereof via a biasing circuit 120. The other terminal of each respective switch $SW_1$, $SW_2$ is connected to ground GND through a respective series connected diode $D_1$,$D_2$ and impedance $R_1$,$R_2$ and to a filter 102, 104 for preventing contact bounce from producing a short duration pulse which would upset the logic circuit of FIG. 1 (generally indicated as 100).

Inputs $X_1$,$X_2$ are therefore held low or near ground when their corresponding switch $SW_1$ or $SW_2$ is open and are held high when their corresponding switch $SW_1$ or $SW_2$ is closed.

In the preferred embodiment, the switches $SW_1$, $SW_2$ of the present invention are rolamite switches known in the art. A rolamite switch is an extremely low-friction acceleration-sensing mechanical switch containing a rolling moving part that causes a switch contact to close at a particular acceleration level and to open at a slightly lower acceleration level. It is used to provide switch contact indication of the design levels of acceleration. An example of such switching mechanisms may be found in the patent to Wilks, U.S. Pat. No. 3,452,175, issued June 24, 1969, for "Roller-Band Devices." The circuit of the present invention is intended for use in deriving failsafe indications of acceleration from the rolamite switches $SW_1$, $SW_2$.

CIRCUIT OPERATION

The operation of the circuit of the present invention may be best understood with reference to FIG. 3 which is a Karnaugh diagram illustrating the outputs generated by the circuit of the present invention in response to the inputs introduced thereto at points $X_1$ and $X_2$. Fundamental to the present invention quest for improved reliability, is the present invention's simulation of a parallel or series circuit depending upon the past state of the respective inputs $X_1$, $X_2$. When the detection of a closing of a switch is desirable, the switches in question should be connected in parallel to improve detection reliability. Conversely, when it is desirable to detect the opening of a switch, the switches are desirably serially connected in order to increase the reliability of detection of a switch opening.

The circuit of the present invention simulates the arrangement of the switches interconnected to the inputs $X_1$, $X_2$ as parallel or series circuitry depending upon the past state of the inputs $X_1$, $X_2$. In the case where both of these inputs are open, it is desirable to detect a switch closing. Thus, it is desirable to simulate the parallel interconnection of the switches. In the case where both switches are closed and a switch opening is to be detected, the circuit should simulate the serial connection of the switches in order to best detect such an opening.

The circuit of FIG. 1 by virtue of the use of a memory or storage element retains within the circuit knowledge of what state both switches were last in. This information is used to enable the circuit of the present invention to simulate series or parallel interconnection of the switches.

Referring to FIG. 3, a Karnaugh Map showing the output of the circuit of the present invention is illustrated. As can be seen from the Karnaugh Map of FIG. 3 and the equations set forth in the specification of the present application, the output of the circuit of the present invention will be a "1" when both inputs are "1" and will be a "0" when both inputs are "0". Thus, when both switches function properly and simultaneously, they will act as a single switch. When one switch leads or lags the other or fails to operate, then the circuit of the present invention will simulate the parallel interconnection of the switches when open during their last common state or the series interconnection of the switches when closed during their last common state. Thus, if the last simultaneous state was a "0", if either of the switches is actuated to produce a logical "1", the output will also be a logical "1". Similarly, if the last common state was a "1" and either of the switches closes to drive its respective input $X_1$, or $X_2$ to a logical "0", then the output of the circuit will be "0" as the circuit simulates the serial interconnection of the respective switches.

Applicant's invention is described hereinabove with reference to the preferred embodiment. However, it will be obvious that the same may be varied in many ways. Such variations may include an increase in the number of switches or inputs monitored and should not be regarded as a departure from the spirit and scope of the invention. All modifications which would be obvious to one skilled in the art are intended to be included within the scope of the following claims.

I claim:

1. A system for enhancing switch reliability comprising:
    first and second switches, each having open and closed output states;
    memory means operatively connected to first and second switches for storing the last common output state simultaneously held by both said switches; and
    logic means responsive to said memory means and said first and second switches for generating a first system output when both said switches are closed or when one of said switches closes when said last common output was open and for generating a second system output when both said switches are open or when one of said switches opens when said last common output was closed.

2. The system of claim 1 wherein said first system output simulates a closed switch and said second output simulates an open switch.

3. The system of claim 2 wherein said memory means is a flip-flop.

4. The system of claim 3 wherein said first and second switches are rolamites.

5. A system for enhancing switch reliability comprising:
    first and second switches, each having open and closed output states;
    memory means operatively connected to said first and second switches for storing the last common output state simultaneously held by both said switches; and
    logic means responsive to said first and second switches and said memory means for generating a first logic output state simulating the output produced by said first and second switches in parallel when the last output state common to both said switches was the open state and for generating a second logic output state simulating the output produced by said first and second switches in series when the last output state common to both said switches was the closed state.

6. The system of claim 5 wherein said first system output simulates a closed switch and said second output simulates an open switch.

7. The system of claim 6 wherein said memory means is a flip-flop.

8. The system of claim 7 wherein said first and second switches are rolamites.

9. A logic circuit for enhancing switch reliability by monitoring at least first and second redundant switches having open and closed states represented as logic high and low output states and producing a fail safe output comprising:
    first logic means monitoring the output states of said first and second redundant switches for generating a first logical product output representing the product of the output states of said switches;
    second logic means monitoring the output states of said first and second redundant switches for generating a second logical product output representing the product of the logical inverse of the output states of said switches;
    flip-flop means responsive to said first and second logical product outputs from said first logic means and said second logic means for storing the last common output state simultaneously held by said first and second switches;
    third logic means responsive to said flip-flop means and said first and second logic means for generating an output representative of the logical product of the output states of said first and second switches logically summed with the product of the sum of the output states of said first and second switches and the logical inverse of said last common output state.

10. The circuit of claim 9 wherein said output produced by said third logic means is either a first logic output state simulating the output produced by said first and second switches in parallel when the last output state common to both said switches was the open state or a second logic output state simulating the output produced by said first and second switches in series when the last output state common to both said switches was the closed state.

11. The system of claim 10 wherein said first and second switches are rolamites.

12. A method for enhancing switch reliability comprising:
    monitoring the outputs of first and second redundant switches;
    memorizing the last output state common to both said switches;
    generating a first system output simulating the output produced by said first and second redundant switches in parallel when said switches had an open last output state and a second system output simulating the output of said first and second redundant switches in series when said switches had a closed last output state.

13. The method of claim 12 wherein said step of generating produces a first system output when both said switches are closed or when one of said switches closes when said last common output was open and produces a second system output when both said switches are open or when one of said switches opens when said last common output was closed.

14. The method of claim 13 wherein said first system output simulates a closed switch while said second system output simulates an open switch.

* * * * *